United States Patent
Taylor et al.

(10) Patent No.: US 12,236,339 B2
(45) Date of Patent: Feb. 25, 2025

(54) CONTROL INPUT SCHEME FOR MACHINE LEARNING IN MOTION CONTROL AND PHYSICS BASED ANIMATION

(71) Applicant: Sony Interactive Entertainment Inc., Tokyo (JP)

(72) Inventors: Michael Taylor, San Mateo, CA (US); Sergey Bashkirov, Novato, CA (US)

(73) Assignee: Sony Interactive Entertainment Inc., Tokyo (JP)

( * ) Notice: Subject to any disclaimer, the term of this patent is extended or adjusted under 35 U.S.C. 154(b) by 1173 days.

(21) Appl. No.: 16/693,093

(22) Filed: Nov. 22, 2019

(65) Prior Publication Data
US 2021/0158141 A1    May 27, 2021

(51) Int. Cl.
| | | |
|---|---|---|
| G06N 3/08 | (2023.01) | |
| G05B 13/02 | (2006.01) | |
| G06F 30/27 | (2020.01) | |
| G06N 3/02 | (2006.01) | |
| G06T 13/00 | (2011.01) | |
| G06T 13/40 | (2011.01) | |
| A63F 13/57 | (2014.01) | |
| B25J 9/16 | (2006.01) | |
| G06N 3/006 | (2023.01) | |

(52) U.S. Cl.
CPC .............. *G06N 3/08* (2013.01); *G05B 13/027* (2013.01); *A63F 13/57* (2014.09); *B25J 9/1671* (2013.01); *G06F 30/27* (2020.01); *G06N 3/006* (2013.01); *G06N 3/02* (2013.01); *G06T 13/00* (2013.01); *G06T 13/40* (2013.01)

(58) Field of Classification Search
CPC . G06N 3/08; G06N 3/006; G06N 3/02; G05B 13/027; A63F 13/57; G06F 30/27; B25J 9/1671; G06T 13/00; G06T 13/40
USPC .......................................................... 345/474
See application file for complete search history.

(56) References Cited

U.S. PATENT DOCUMENTS

| | | |
|---|---|---|
| 5,719,480 A | 2/1998 | Bock et al. |
| 9,786,202 B2 | 10/2017 | Huang et al. |

(Continued)

FOREIGN PATENT DOCUMENTS

| | | |
|---|---|---|
| CA | 3133873 A1 | 4/2020 |
| CN | 107610208 A | 1/2018 |

(Continued)

OTHER PUBLICATIONS

Erlhagen et al, "The dynamic neural field approach to cognitive robotics" In J. Neural Eng. 3 (2006), R36-R54, [online] [retrieved on Jan. 5, 2022 (Jan. 5, 20220] Retrieved from the Internet.

(Continued)

*Primary Examiner* — Hai Tao Sun
(74) *Attorney, Agent, or Firm* — Fish & Richardson P.C.

(57) ABSTRACT

A method, system and non-transitory instructions for control input, comprising, taking an integral of an output value from a Motion Decision Neural Network for a movable joint to generate an integrated output value. Generating a subsequent output value using a machine learning algorithm that includes a sensor value and the integrated output value as inputs to the Motion Decision Neural Network and imparting movement with the moveable joint according to an integral of the subsequent output value.

33 Claims, 7 Drawing Sheets

(56) References Cited

U.S. PATENT DOCUMENTS

| | | | |
|---|---|---|---|
| 10,937,240 B2 | 3/2021 | Anderson | |
| 11,278,433 B2 | 3/2022 | Herr et al. | |
| 2003/0216895 A1 | 11/2003 | Ghaboussi et al. | |
| 2005/0179417 A1 | 8/2005 | Takenaka et al. | |
| 2007/0255454 A1* | 11/2007 | Dariush | G06N 3/008 |
| | | | 700/245 |
| 2008/0027582 A1 | 1/2008 | Obinata et al. | |
| 2011/0270443 A1 | 11/2011 | Kamiya et al. | |
| 2012/0166165 A1* | 6/2012 | Nogami | B25J 9/1671 |
| | | | 703/6 |
| 2014/0107841 A1 | 4/2014 | Danko | |
| 2017/0083047 A1 | 3/2017 | Hélot et al. | |
| 2017/0183047 A1 | 6/2017 | Takagi et al. | |
| 2017/0252922 A1* | 9/2017 | Levine | G06N 3/084 |
| 2017/0334066 A1* | 11/2017 | Levine | G05B 13/027 |
| 2018/0001206 A1* | 1/2018 | Osman | A63F 13/798 |
| 2018/0250812 A1 | 9/2018 | Narukawa | |
| 2019/0324538 A1 | 10/2019 | Rihn et al. | |
| 2019/0384316 A1 | 12/2019 | Qi et al. | |
| 2020/0139539 A1 | 5/2020 | Hasunuma et al. | |
| 2020/0143229 A1 | 5/2020 | Made et al. | |
| 2020/0160535 A1 | 5/2020 | Akbarian et al. | |
| 2020/0218365 A1 | 7/2020 | Todorov et al. | |
| 2020/0290203 A1 | 9/2020 | Taylor et al. | |
| 2020/0293881 A1 | 9/2020 | Taylor | |
| 2020/0319721 A1* | 10/2020 | Erivantcev | G06F 3/017 |

FOREIGN PATENT DOCUMENTS

| | | |
|---|---|---|
| CN | 110007750 A | 7/2019 |
| CN | 111653010 A | 9/2020 |
| TW | 201905729 A | 2/2019 |
| TW | 202026846 A | 7/2020 |
| WO | 2012079541 A1 | 6/2012 |
| WO | 2017129200 A1 | 8/2017 |
| WO | 2020008878 A1 | 1/2020 |

OTHER PUBLICATIONS

Hu et al, "Impedance with Finite-Time Control Scheme for Robot-Environment Interaction" in Mathematical Problems in Engineering, vol. 2020, Article ID 2796590, 18 Pages May 25, 2020, [online] [retrieved on Jan. 5, 2022 (Jan. 5, 20220] Retrieved from the Internet.

International Search Report and Written Opinion for International Application No. PCT/US2021/58388, Feb. 4, 2022.

International Search Report and Written Opinion for International Application No. PCT/US2021/58390, Feb. 7, 2022.

International Search Report and Written Opinion for International Application No. PCT/US2021/58392, Feb. 7, 2022.

Peng et al., "Sim-to-Real Transfer of Robotic Control with Dynamics Randomization" in arXiv:1710.06537, 8 Pages, Submitted on Oct. 18, 2017 (v1), last revised Mar. 3, 2018 (this version, v3)], [online] [retrieved on Apr. 13, 2022 (Apr. 13, 2022] Retrieved from the Internet.

Taiwanese Office Action for Country Code Application No. 893689, dated Jun. 28, 2022.

Arthur Juliani "Simple Reinforcement Learning with Tensorflow Part 8: Asynchronous Actor-Critic Agents (A3C)" Medium, Dated: Dec. 16, 2016, Available at: https://medium.com/emergent-future/simple-reinforcement-learning-with-tensorflow-part-8-asynchronous-actor-critic-agents-a3c-c88f72a5e9f2.

Arthur Juliani, "Simple reinforcement Learning with Tensorflow Part 0: Q-learning with Tables and Neural Networks" Medium, dated: Aug. 25, 2016. Available at: https://medium.com/emergent-future/simple-reinforcement-learning-with-tensorflow-part-0-q-learning-with-tables-and-neural-networks-d195264329d0.

Arthur Juliani, "Simple Reinforcement Learning with Tensorflow: Part 2—Policy-based Agents" Medium, Dated: Jun. 24, 2016. Available at: https://medium.com/@awjuliani/super-simple-reinforcement-learning-tutorial-part-2-ded33892c724.

Zaiqiang Wu, et al. "Analytical Derivatives for Differentiable Renderer: 3D Pose estimation by Silhouette Consistency" Zhejiang University, ArXiv:1906.07870v1, Jun. 19, 2019 available at: https://arxiv.org/pdf/1906.07870v1.pdf.

Coulom, Remi "Apprentissage par renforcement utilsant des resaux de neurones, avec des applications au control moteur" PHD Thesis Institute Nat. Polytech. of Grenoble Jun. 19, 2002.

Ghoshavi, Abhijit "Neural Networks and Reinforcement Learning" Slide presentation Dept. of Eng. Mgmt. and Sys. Eng. Missouri Univ. of Sci. and Tech. Accessed Nov. 6, 2019.

Kniewasser, Gerhard et al. "Reinforcemetn Learning with Dynamic Movement Primitives—DMPs" Dept. of Theoretical Comp. Sci. Univ. of Tech., Graz (2013) Accessed Nov. 6, 2019.

Kober, Jens et al. "Reinforcement Learning to Adjust Robot Movements to New Situations" Proceedings of the Twenty-Second Int. Joint Conf. on Artificial Intelligence p. 2650-2655 Accessed Nov. 6, 2019.

Peng, Xue Bin, and Michiel van de Panne. "Learning Locomotion Skills Using DeepRL." Proceedings of the ACM SIGGRAPH / Eurographics Symposium on Computer Animation—SCA '17 (2017).

Sepp Hochreiter et al., "Long Short-Term Memory", Neural Computation, 9(8) 1735-1780, 1997, Cambridge, MA.

Non-Final Office Action for U.S. Appl. No. 17/095,617, dated Oct. 26, 2023.

Non-Final/Final Office Action for U.S. Appl. No. 17/095,640, dated Sep. 13, 2023.

Notice of Allowance for U.S. Appl. No. 17/095,640, dated Feb. 22, 2024.

Final Office Action for U.S. Appl. No. 17/095,617, dated Apr. 19, 2024.

Bazzi, D., Messeri C., Zanchettin A. M., Rocco P. "Identification of Robot Forward Dynamics via Neural Network" Oct. 2020, 4th international Conference on Automation, Control and Robotics (ICACR) (pp. 13-21), IEEE. (Year:2020).

Final Office Action for U.S. Appl. No. 17/095,586, dated Sep. 25, 2024.

Kiemel, J. C. et al. "Learning Robot Trajectories Subject to Kinematic Joint Constraints," Nov. 1, 2020. arXiv preprint arXiv: 2011.00563. (Year:2020).

Kiemel, J.C. et al. True Aedept: Learning Smooth Online Trajectory Adaptation with Bounded Jerk, Acceleration and Velocity in Joint Space. Oct. 2020. In 2020 IEEE/RSJ International Conference on Intelligent Robots and Systems (IROS) (pp. 5387-5394). IEEE. (YEar:2020).

Non-Final Office Action for U.S. Appl. No. 17/095,586, dated May 6, 2024.

Non-Final Office Action for U.S. Appl. No. 17/095,617, dated Dec. 4, 2024.

* cited by examiner

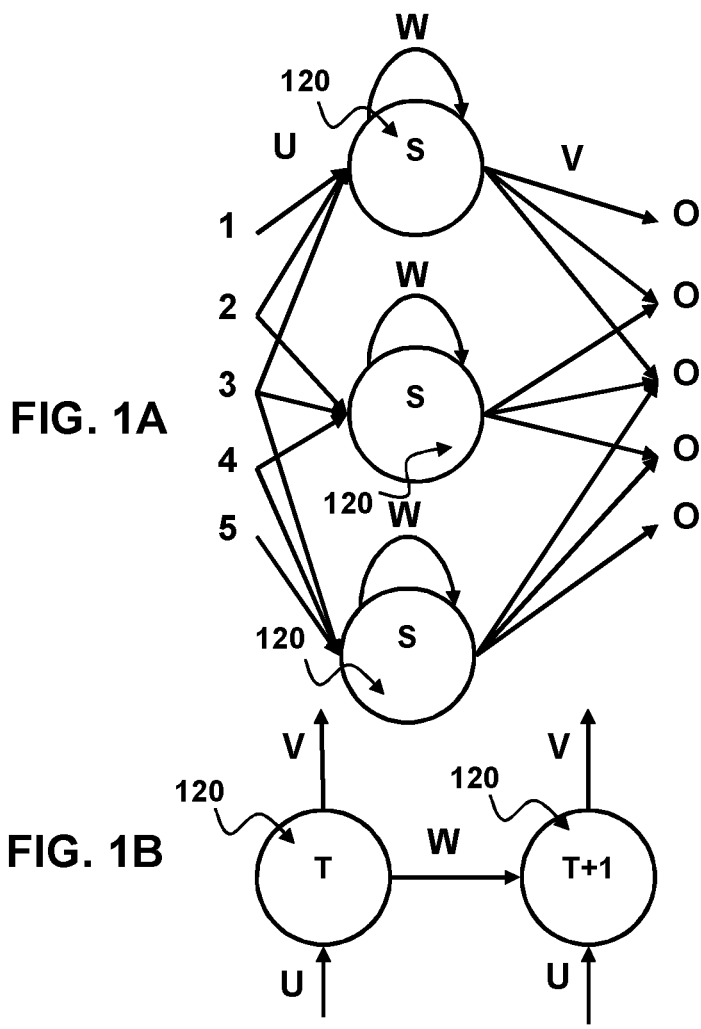
FIG. 1A
FIG. 1B
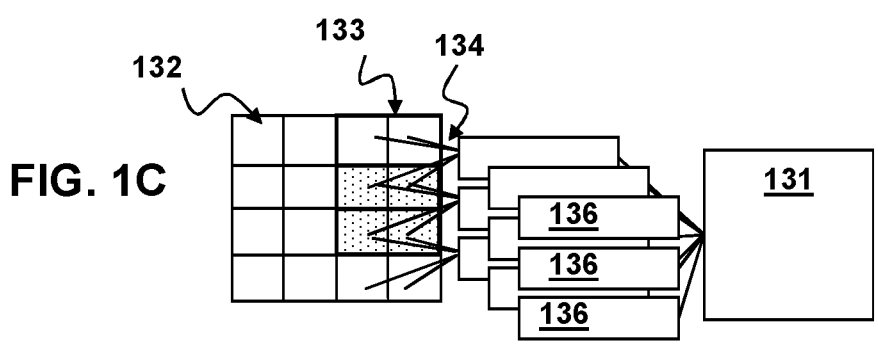
FIG. 1C

CONTROL INPUT SCHEME FOR MACHINE LEARNING IN MOTION CONTROL AND PHYSICS BASED ANIMATION

FIELD OF THE DISCLOSURE

Aspects of the present disclosure relate to motion control using machine learning specifically aspects of the present disclosure relate to the training and use of Neural Networks in physics based animation and motion control systems.

BACKGROUND OF THE DISCLOSURE

A common technique for models is to create a virtual skeleton for the model with flexible or movable joints and rigid bones. A virtual skin is overlaid on top the virtual skeleton similar to how human muscle, fat, organs, and skin is integrated over bones. Human artists then painstakingly hand animate movement sets for the object using the virtual skeleton as a guide for the range of motion. This is a time consuming process and also requires an artistic touch as there is a narrow window between life like movements and movements that fall into the uncanny valley. Some production studios avoid the difficult and time-consuming process of life-like animation by employing motion capture of human models. This technique is expensive and can be time consuming if a large number of motions are required or if there are many different characters that need to be modeled.

Robots may be modeled virtually with bones for rigid sections and joints for movable sections. This type of model control makes it easier for robot animators to create life-like movements for the robot. Movement of the joints in the virtual skeleton may be translated to movement of the motors controlling the joints in the robot. The virtual model applies constraints to the joints to simulate the real world limitations of the joints of the robot. Thus, a virtual model of the robot may be used to control the physical robot. This sort of control is useful for animatronics.

A major problem with animation is the need for human controlled movement creation. Hand animation of characters is time consuming and infeasible for situations where many characters are needed with different movement characteristics, such as a scene of a mall in space where there are many different alien characters that have vastly different anatomies. One technique that has been used to lighten the load of animators in these situations is to generate one or two different movement models and then apply those movement models randomly to moving characters in the scene. This technique works well with many different models and a few different characters but on large scale, it creates a noticeable unnatural effect where many characters obviously are identical.

Machine learning represents an area that could be employed in character animation to reduce the need for human animators. Currently movement produced by neural networks trained using machine learning techniques results in unnatural jittery movements and special efforts have to be taken and or constraints on the solution put in place to avoid the problem of jitter.

It is within this context that aspects of the present disclosure arise.

BRIEF DESCRIPTION OF THE DRAWINGS

The teachings of the present disclosure can be readily understood by considering the following detailed description in conjunction with the accompanying drawings, in which:

FIG. 1A is a simplified node diagram of a neural network for use in motion control according to aspects of the present disclosure.

FIG. 1B is a simplified node diagram of an unfolded neural network for use in motion control according to aspects of the present disclosure.

FIG. 1C is a simplified diagram of a convolutional neural network for use in motion control according to aspects of the present disclosure.

DESCRIPTION OF THE SPECIFIC EMBODIMENTS

Figure 1D:
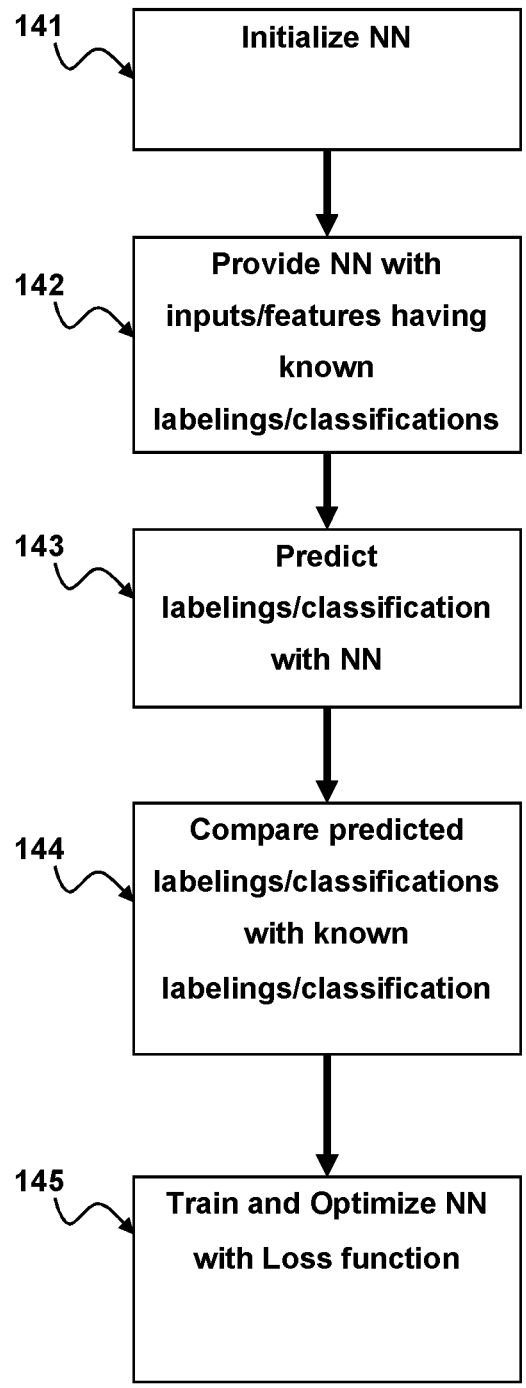
FIG. 1D is a block diagram of a method for training a neural network in development of motion control to aspects of the present disclosure.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Physics based animation requires a control scheme to generate joint actuator commands in such a way that it fulfills 3 goals at the same time: 1) approximately follow target animation; 2) preserve balance (don't fall down in case of walk, for example); 3) recover from external disturbances such as stumbling, external force, real/virtual model mismatch. According to aspects of the present disclosure, smooth life-like motions of a character may be obtained through training a NN to accept controlled mechanism/object sensor readings/observations as inputs and outputs either first or second derivative of mechanism servo control commands. The commands in the case of first derivative are passed through external time integration. Output of time integration goes a) back to NN and b) to controlled mechanism. In the case of second derivative described above pattern is repeated twice. After first integration, result goes a) back to NN and b) to second integration. After second integration, the output similarly goes a) back to NN and b) to controlled mechanism.

General Neural Network Training

According to aspects of the present disclosure, the control input scheme may use machine learning with neural networks (NN). The NNs may include one or more of several different types of neural networks and may have many different layers. By way of example and not by way of limitation the neural network may consist of one or multiple convolutional neural networks (CNN), recurrent neural networks (RNN) and/or dynamic neural networks (DNN). The Motion Decision Neural Network may be trained using the general training method disclosed herein.

FIG. 1A depicts the basic form of an RNN having a layer of nodes 120, each of which is characterized by an activation function S, one input weight U, a recurrent hidden node transition weight W, and an output transition weight V. The activation function S may be any non-linear function known in the art and is not limited to the (hyperbolic tangent (tan h) function. For example, the activation function S may be a Sigmoid or ReLu function. Unlike other types of neural networks, RNNs have one set of activation functions and weights for the entire layer. As shown in FIG. 1B, the RNN may be considered as a series of nodes 120 having the same activation function moving through time T and T+1. Thus, the RNN maintains historical information by feeding the result from a previous time T to a current time T+1.

In some embodiments, a convolutional RNN may be used. Another type of RNN that may be used is a Long Short-Term Memory (LSTM) Neural Network which adds a memory block in a RNN node with input gate activation function, output gate activation function and forget gate activation function resulting in a gating memory that allows the network to retain some information for a longer period of time as described by Hochreiter & Schmidhuber "Long Short-term memory" Neural Computation 9(8):1735-1780 (1997), which is incorporated herein by reference.

FIG. 1C depicts an example layout of a convolution neural network such as a CRNN according to aspects of the present disclosure. In this depiction, the convolution neural network is generated for an input 132 with a size of 4 units in height and 4 units in width giving a total area of 16 units. The depicted convolutional neural network has a filter 133 size of 2 units in height and 2 units in width with a skip value of 1 and a channel 136 of size 9. For clarity in FIG. 2C only the connections 134 between the first column of channels and their filter windows is depicted. Aspects of the present disclosure, however, are not limited to such implementations. According to aspects of the present disclosure, the convolutional neural network that may have any number of additional neural network node layers 131 and may include such layer types as additional convolutional layers, fully connected layers, pooling layers, max pooling layers, local contrast normalization layers, etc. of any size.

As seen in FIG. 1D Training a neural network (NN) begins with initialization of the weights of the NN at 141. In general, the initial weights should be distributed randomly. For example, an NN with a tan h activation function should have random values distributed between $$-\frac{1}{\sqrt{n}} \text{ and } \frac{1}{\sqrt{n}}$$

where n is the number of inputs to the node.

After initialization the activation function and optimizer is defined. The NN is then provided with a feature vector or input dataset at 142. Each of the different feature vectors may be generated by the NN from inputs that have known labels. Similarly, the NN may be provided with feature vectors that correspond to inputs having known labeling or classification. The NN then predicts a label or classification for the feature or input at 143. The predicted label or class is compared to the known label or class (also known as ground truth) and a loss function measures the total error between the predictions and ground truth over all the training samples at 144. By way of example and not by way of limitation the loss function may be a cross entropy loss function, quadratic cost, triplet contrastive function, exponential cost, etc. Multiple different loss functions may be used depending on the purpose. By way of example and not by way of limitation, for training classifiers a cross entropy loss function may be used whereas for learning pre-trained embedding a triplet contrastive function may be employed. The NN is then optimized and trained, using the result of the loss function and using known methods of training for neural networks such as backpropagation with adaptive gradient descent etc., as indicated at 145. In each training epoch, the optimizer tries to choose the model parameters (i.e., weights) that minimize the training loss function (i.e. total error). Data is partitioned into training, validation, and test samples.

During training, the Optimizer minimizes the loss function on the training samples. After each training epoch, the model is evaluated on the validation sample by computing the validation loss and accuracy. If there is no significant change, training can be stopped and the resulting trained model may be used to predict the labels of the test data.

Thus, the neural network may be trained from inputs having known labels or classifications to identify and classify those inputs. Similarly, a NN may be trained using the described method to generate a feature vector from inputs having a known label or classification. While the above discussion is relation to RNNs and CRNNS the discussions may be applied to NNs that do not include Recurrent or hidden layers.

Reinforcement Learning

According to aspects of the present disclosure, the NN training may include reinforcement learning. Reinforcement Learning is an area of machine learning concerned with how software agents ought to take actions in an environment so as to maximize some notion of cumulative reward. It may be used without a neural network but in situations where there are many possible actions a NN layout may be employed to capture the elements in reinforcement learning.

The goal of reinforcement learning is to choose the optimal action based on a current state. A reward mechanic is used to train the reinforcement model to make the correct decision based on the state. It should be noted that the reinforcement model is not limited to Neural Network and may include for example and without limitation values in a table or spreadsheet.

Figure 2:
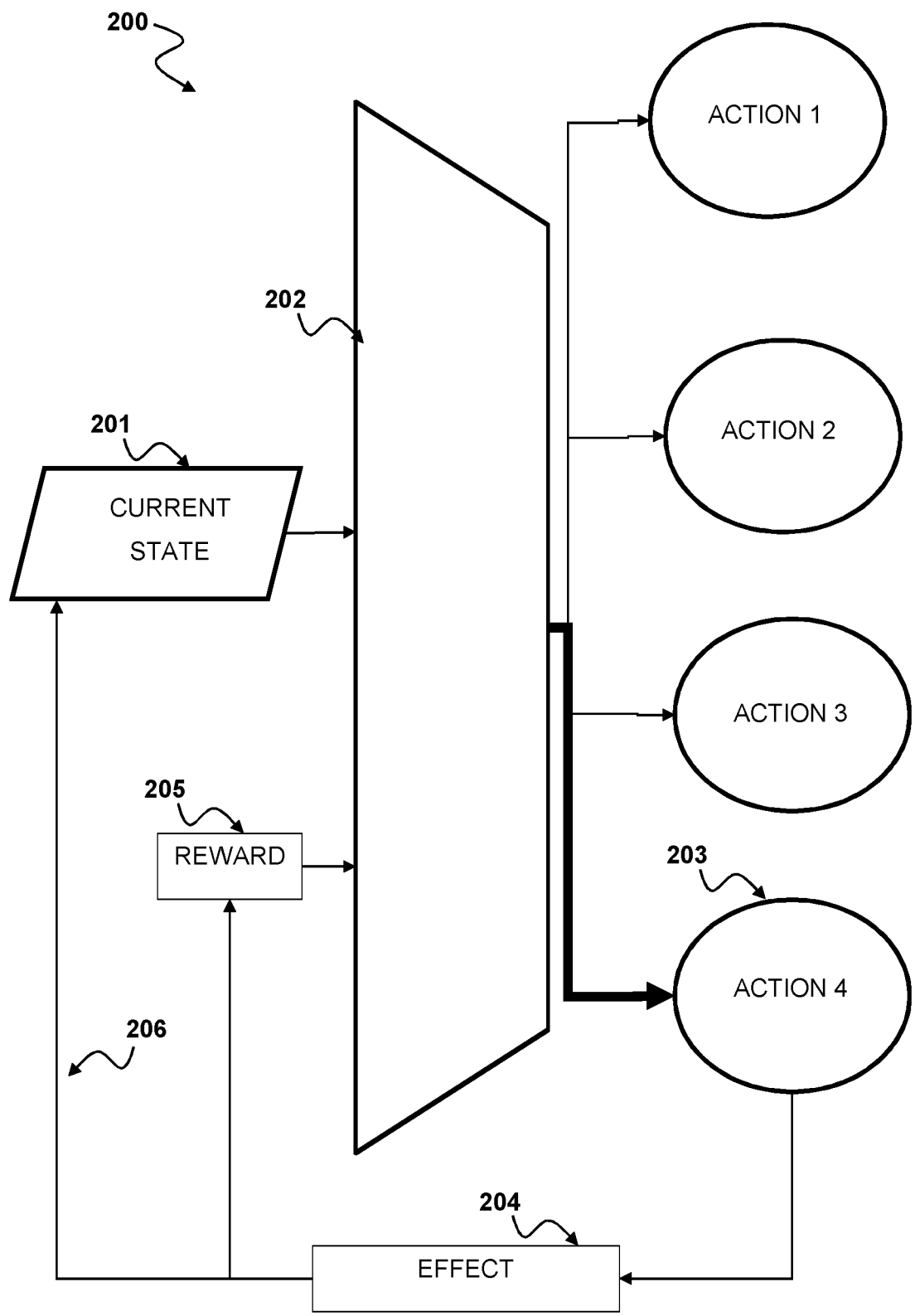
FIG. 2 is a block diagram showing reinforcement learning implemented with neural networks and machine learning algorithms according to aspects of the present disclosure.

FIG. 2 shows reinforcement learning implemented with neural networks and machine learning algorithms 200. The reinforcement learning algorithm as discussed above seeks to determine an action 203 from a current 201. Once an action is chosen, the effect of the action is determined 204 and a reward function 205 is applied based on how closely the effect achieved an optimal action or chosen goal. A motion decision NN 202 may be employed to determine the action 203 from the current state 201. Additionally, the current state information 201 is updated 206 with the effect 204 information and the NN can predict information based on the updated current state for a next action. In some embodiments, the NN 203 may be trained with a machine learning algorithm that uses Q-learning feedback as a value in the loss function for training the NN. For example and without limitation the loss function for the NN used reinforcement learning may be a sum of squares function. The sum of squares loss function with feedback is given by the equation here Q is the output of the NN:

$$\text{Loss} = \Sigma(\text{feedback} - Q)^2 \qquad \text{EQ. 1}$$

In reinforcement learning one example of feedback may be given by the Q-learning equation:

$$\text{feedback} = r(i,a,j) + \lambda \max_b Q(j,b) \qquad \text{EQ. 2}$$

Where the immediate reward is denoted by r(i, a, j,) where i is the current state, a is the action chosen at current state and j is the next state. The value of any state is given by the maximum value of Q value of actions in that state. Thus max Q(j,b) represents the expected reward from the best possible action taken at the following state. λ represents the a future state discounting factor which serves to bias learning towards choosing immediate rewards. In some embodiments the λ=1/(1+R) where R is a discounting rate chosen to suit the particular task being learned. In the case of applications using Q-learning the controls must be made discrete for applications involving physical simulations or robots.

Thus, in reinforcement learning after an action is taken a feedback is calculated and a loss function is calculated using the feedback. The model is then updated using the loss function and backpropagation with adaptive gradient descent.

In other embodiments, a Proximal Policy Optimization training algorithm may be used. Such an algorithm uses two networks: a Policy network to determine which action to take and an Advantage network to determine how good each action is, given the current state. Some implementations of the motion decision NNs 202 may include a policy subnetwork configured to provide a probability distribution for each action that is optimal for achieving the desired effect 204 given the current state 201 and an advantage subnetwork for determining how good each action is given the current state 201. In other words, the policy $\pi(s,a)=p(a|s)$ represents the conditional probability density function of selection action $a \in A$ in state $s \in S$ at each control step t; the network receives a state $s_t$ and samples an action $a_t$ from $\pi$. The environment responds 204 with a scalar reward $r_t$ 205 and a new state $s_t'=s_{t+1}$ 206 sampled from its dynamics p(s'|s,a). For a parameterized policy, $\pi_\theta(s,a)$ the goal of the agent is to learn the parameters θ, which maximize cumulative reward given by the equation:

$$J(\pi_\theta) = E[\Sigma_{t=0}^T \gamma^t r_t | \pi_\theta] \qquad \text{EQ. 3}$$

Where $\gamma \in [0,1]$ a discounting factor and T is the training horizon. The gradient of the expected reward $\nabla_\theta J(\pi_\theta)$ can be determined using a policy gradient theory, which adjusts policy parameter θ to provide a direction of improvement according to the equation:

$$\nabla_\theta J(\pi_\theta) = \int_S d_\theta(s) \int_A \nabla_\theta \log(\pi_\theta(s,a)) \mathbb{A}(s,a) da ds \qquad \text{EQ. 4}$$

$d_\theta(s) = \int_S \Sigma_{t=0}^T \gamma^t p_0(s_0)(p(s_0 \to s|t, \pi_\theta)) ds_0$ is a discounted state distribution, $p_0$ is an initial state distribution and $p(s_0 \to s|t,\pi_\theta)$ models the likelihood of reaching state s by starting at $s_0$ and following the policy $\pi_\theta(s,a)$ for T steps. $\mathbb{A}(s,a)$ represents a general advantage function. There are many advantage functions for policy gradient based reinforcement learning and any suitable advantage function may be used with this function according to aspects of the present disclosure. One advantage function that may be used is a one-step temporal advantage function given by the equation:

$$\mathbb{A}(s_t,a_t) = r_t + \gamma V(s_t') - V(s_t) \qquad \text{EQ. 5}$$

Where $V(s) = \mathbb{E}[\Sigma_{t=0}^T \theta^t r_t | s_0 = s, \pi_\theta]$ is a state-value function defined recursively through EQ. 6

$$V(s_t) = \mathbb{E}_{r_t,s_t'}[r_t + \gamma V(s_t') | s_t, \pi_\theta] \qquad \text{EQ. 6}$$

Parameterized value function $V\phi(s)$, with parameters φ are learned iteratively similar to Q-learning as described above. The bellman loss function is minimized in this case according to the form:

$$L(\phi) = \mathbb{E}_{s_t,r_t,s_t'}[\tfrac{1}{2}(y_t - V_\phi(s_t))^2], y_t = r_t + \gamma V_\phi(s_t') \qquad \text{EQ. 7}$$

$\pi_\theta$ and $V_\phi$ are trained in tandem using an actor critic framework. The action network may be biased toward exploration using a Gaussian distribution with a parameterized mean $\mu_\theta$ and a fixed covariance matrix $\Sigma = \text{diag}\{\sigma_i^2\}$ where $\sigma_i$ is specified for each action parameter. Actions are sampled from the distribution by applying Gaussian noise to the mean action choice EQ. 8

$$a_t = \mu_\theta(s_t) + \mathcal{N}(0,\Sigma) \qquad \text{EQ. 8}$$

The Gradient for maximizing the action choice in EQ. 8 takes the form:

$$\nabla_\theta J(\mu_\theta) = \int_S d_\theta(s) \int_A \nabla_\theta \mu_\theta(s) \Sigma^{-1}(a - \mu_\theta(s)) \mathbb{A}(s,a) da ds \qquad \text{EQ. 9}$$

The result of optimization of the gradient EQ. 9 is to shift the mean of the action distribution towards actions that lead to higher expected rewards and away from lower expected rewards. For additional information see Peng et al. "Learning Locomotion Skills Using Deep RL: Does Choice of Action Space Matter?" SCA'17 Jul. 28, 2017.

Application to Movement

According to aspects of the present disclosure, the NN may be trained with a machine-learning algorithm to mimic realistic movement. The training set may be for example and without limitation, a time sequence of positions in space, directions, and/or orientations of a preselected subset of controlled object body parts. It is up to the machine learning algorithm to prepare a NN which is capable of changing joint angles in such a way that the controlled object exhibits a desired behavior and preserves balance at the same time. By way of example and not by way of limitation, time sequence of positions in space, directions, and/or orientations may be generated by motion capture of real movement, hand animation using motion capture dolls, hand animation using a virtual models, or any other method of capturing a set of realistic movements. In some embodiments, the training may use a reward function that uses misalignment errors of various raw and/or integral parameters which evolve the reward function towards a desired movement.

The State 201 may be a feature transformation $\Phi(q,v,\varepsilon)$ where ε is an integral input taken from the integral of velocity with respect to time $\varepsilon = (\int v dt)$ generated as an output of the NN. According to some alternative aspects of the present disclosure, the feature transformation $\Phi(q,v,\varepsilon,i)$ may be include the second integral of acceleration with respect to time $i = (\int\int A dt)$. The transformation extracts a set of features from inputs to place them in a form compatible with the variable of the model being trained. In training it useful to include target reference motions $\Phi(\hat{q},\hat{v},\hat{\varepsilon})$ thus giving a combined state of $s_t = \Phi(q,v,\varepsilon), \Phi(\hat{q},\hat{v},\hat{\varepsilon})$.

The reward function may consist of a weighted sum of terms that encourage the policy to follow the reference motion:

$$r = w_{position} r_{position} + w_{integral} r_{integral} \qquad \text{EQ. 10}$$

Where w is a weight for the given term and r reference term. According to aspects of the present disclosure, the reward function may include terms for example and without limitation, any of the reference position, velocity, torque, integral inputs and rewards for specific achievements (like lifting a foot when necessary). Additionally the reward function may include penalties subtracted from the reward for doing unwanted like, without limitation, falling down or stumbling. Iterations of the network may be trained updating algorithm to apply updates to the state as soon as possible based on sample rates of the inputs.

For this purpose, input includes as many observations as possible. All available sensor readings are fed into NN. Some sensor readings are also preprocessed. For example, accelerometer and gyroscope readings are fed both as-is and fused into attitude and gravity direction in robot's ref frame. Preprocessed readings are also fed into NN.

Improved Motion Control with NNs

One major problem with NN control is choosing which information to provide to the NN as input, which is enough to restore dynamical state of the system at each moment in time. As depicted on FIG. 3 and FIG. 4 as a matter of feedback control output integral and output second integral in case of FIG. 4 are fed back into NN. As discussed above prior trained NN for movement produced jittery, unrealistic movements. Thus according to aspects of the present disclosure smooth realistic movement by generating an integral of an output of the NN and using input information from a movable joint state input parameters in a NN.

Figure 3:
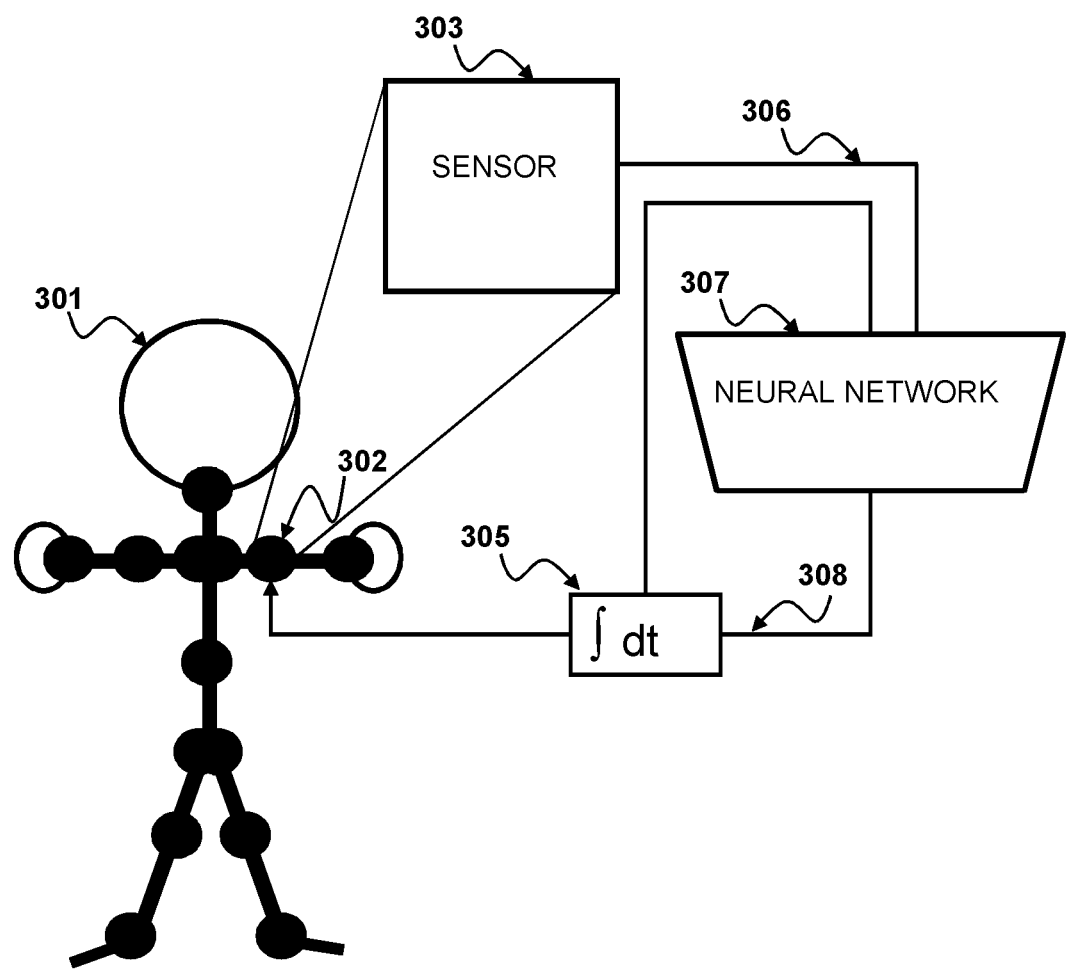
FIG. 3 is a diagram depicting motion control using sensor data and an integrated output that includes an integral according to aspects of the present disclosure.
Figure 4:
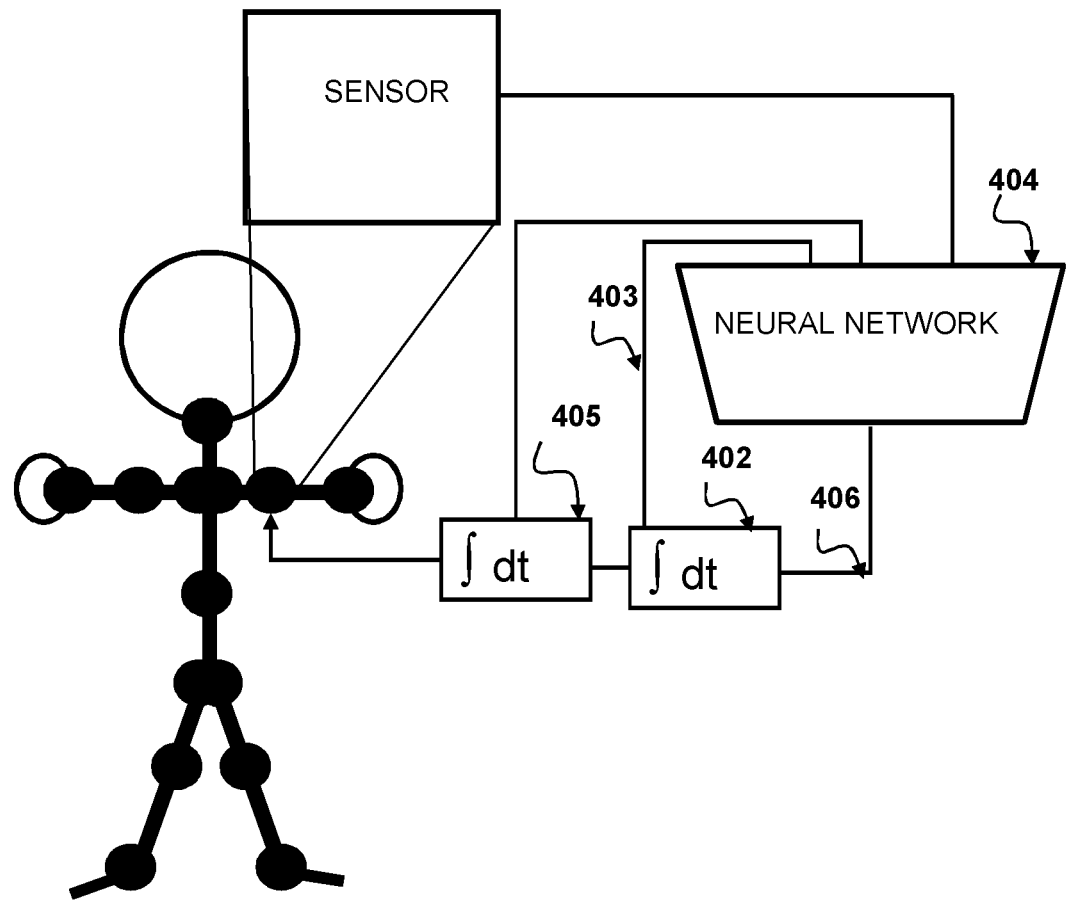
FIG. 4 is a diagram depicting motion control using sensor data and an integrated output that includes a second integral according to aspects of the present disclosure.

FIG. 3 depicts motion control according to aspects of the present disclosure. A character rig 301, which by way of example and not by way of limitation may be a virtual character model, virtual skeleton, robot or robotic apparatus, has at least once movable joint 302. As shown the character rig 302 has multiple movable joints as indicated by the black circles. The movable joint 302 may be a motor actuated hinge, ball joint, or any other connection between two rigid bodies that allows a defined range of controlled relative movement between the two rigid bodies. The movable joint may be connected to a sensor 303, which is configured to generate information about the state of the movable joint, referred to herein as sensor values. This sensor 303 for physical robots may include for example and without limitation, encoders, potentiometers, linear variable differential transformers, pressure sensors, gyroscopes, gravimeters, accelerometers, resolvers, velocity, or speed sensor. The sensor values for such sensors would correspond to the outputs of such sensors or information derived therefrom. Examples of sensor values from sensors on a robot include, but are not limited to a joint position, a joint velocity, a joint torque, a robot orientation, a robot linear velocity, a robot angular velocity, a foot contact point, a foot pressure, or two or more of these. For virtual characters, the sensor 303 may be virtual sensors and the sensor values may simply include data, e.g., position, velocity, acceleration data, related to the state of the movable joint. Examples of sensor values from a robot simulation include, but are not limited to a joint position, a joint velocity, a joint torque, a model orientation, a model linear velocity, a model angular velocity, a foot contact point, a foot pressure, or two or more of these. Position Data from the controller or virtual monitor may be passed 306 to the motion decision neural network 307 and used as state data during reinforcement learning.

As shown in FIG. 3, input information such as from the sensor 303 is passed directly 306 to the NN 307. The integrator 305 receives an output value 308 from the NN 307. The integrator 307 provides the integrated output to the movable joint 302 and as integral output 304 feedback to the NN 307.

The motion decision NN 307 as discussed above, may be trained iteratively using machine learning algorithms that include reinforcement learning techniques such as policy learning. Q-leaning may be applied with discretized controls additionally any other machine learning technique suitable for the task may be used with control scheme provided according to aspects of the present disclosure. The motion decision NNs 307 may include additional subnetworks to generate embeddings or otherwise process state data. The motion decision NNs 307 may be configured to output one or more types of information to the movable joint or a motor/actuator controlling the movable joint.

The movable joint 302 may move based on the information output 309 by the motion decision NN 307 and this change may be detected by the sensor 303. Subsequently the new position and acceleration information may be used by the NN in a repetition of the process described above. This cycle may continue until a goal is achieved.

Here, an improvement to smooth movement imparted with the movable joint is achieved with the addition of integrated output 304 feedback calculated at the integrator 305 from the output 308 of the NN 307. One explanation for the smoothing effect created according to aspects of the present disclosure may be that the integral of the step function is a continuous function and the discontinuous controls output by the NN are converted to continuous actuator controls after going through the integrator.

As shown in FIG. 4 other integrated output feedback may be used as input to the NN create smoother movement. According to alternative aspects of the present disclosure, smooth movement may be created with a motion decision NN 404 using state information that includes a second integrated output 403 feedback value generated from the second integrator 402. first integrator 405 is configured to take the output of the second integrator 402. The output of the first integrator 405 is fed back to the motion decision NN 404.

Figure 5:
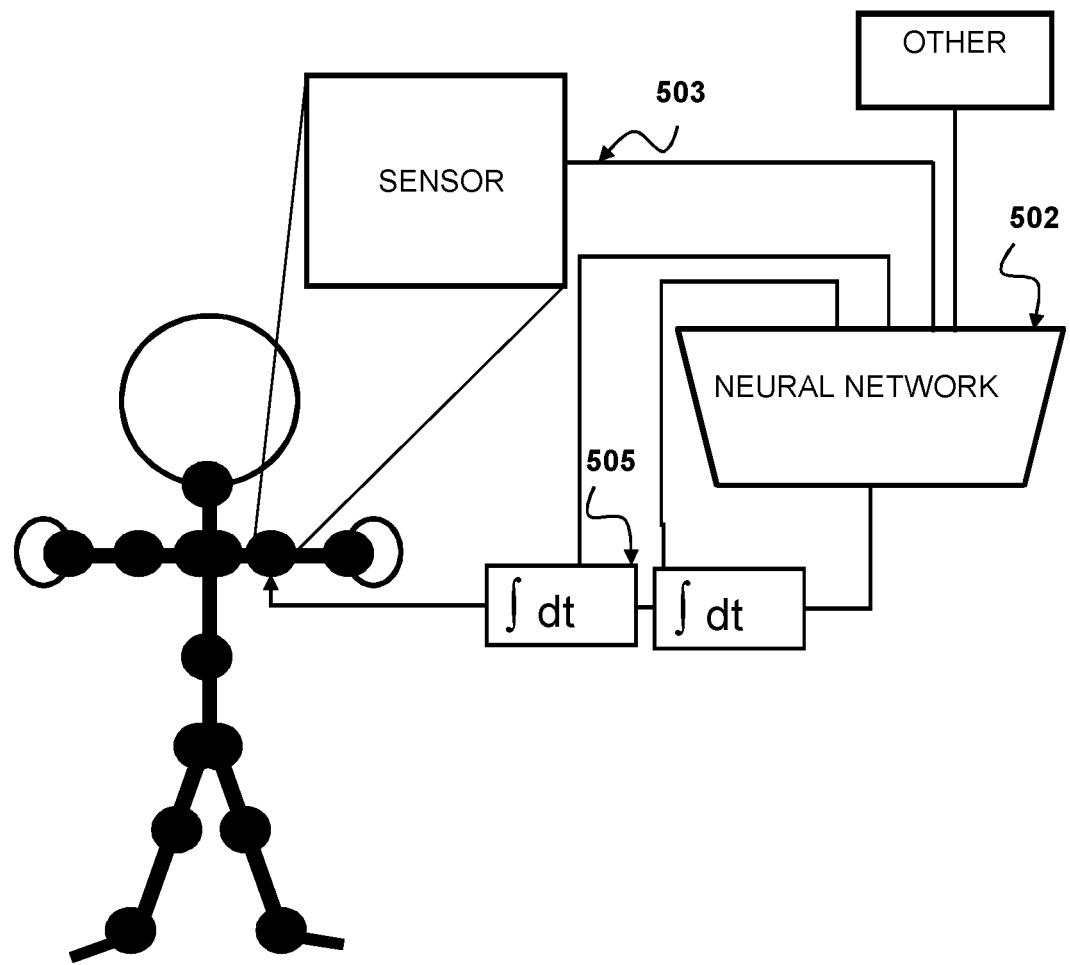
FIG. 5 is a diagram depicting motion control using sensor data, other data and an integrated output that includes a second integral for motion control according to aspects of the present disclosure.

FIG. 5 shows another alternative embodiment of the smooth motion, motion control using NNs according to aspects of the present disclosure. In this embodiment, the other information 505 is generated by other sensors and passed 503 to the motion decision NNs 502. The other information may be without limitation, visual information, motion information or sound information that indicate the presence of a person or other important object. The addition of other information aids allows the motion decision NNs 502 to produce more situationally appropriate movements by providing more information to use in motion decision.

It should be noted that the controller or variable monitor according to aspects of the present disclosure may also detect torque from the movable joint and the torque information may also be provided to the NNs. The NNs may also be configured to produce torque information.

Figure 6:
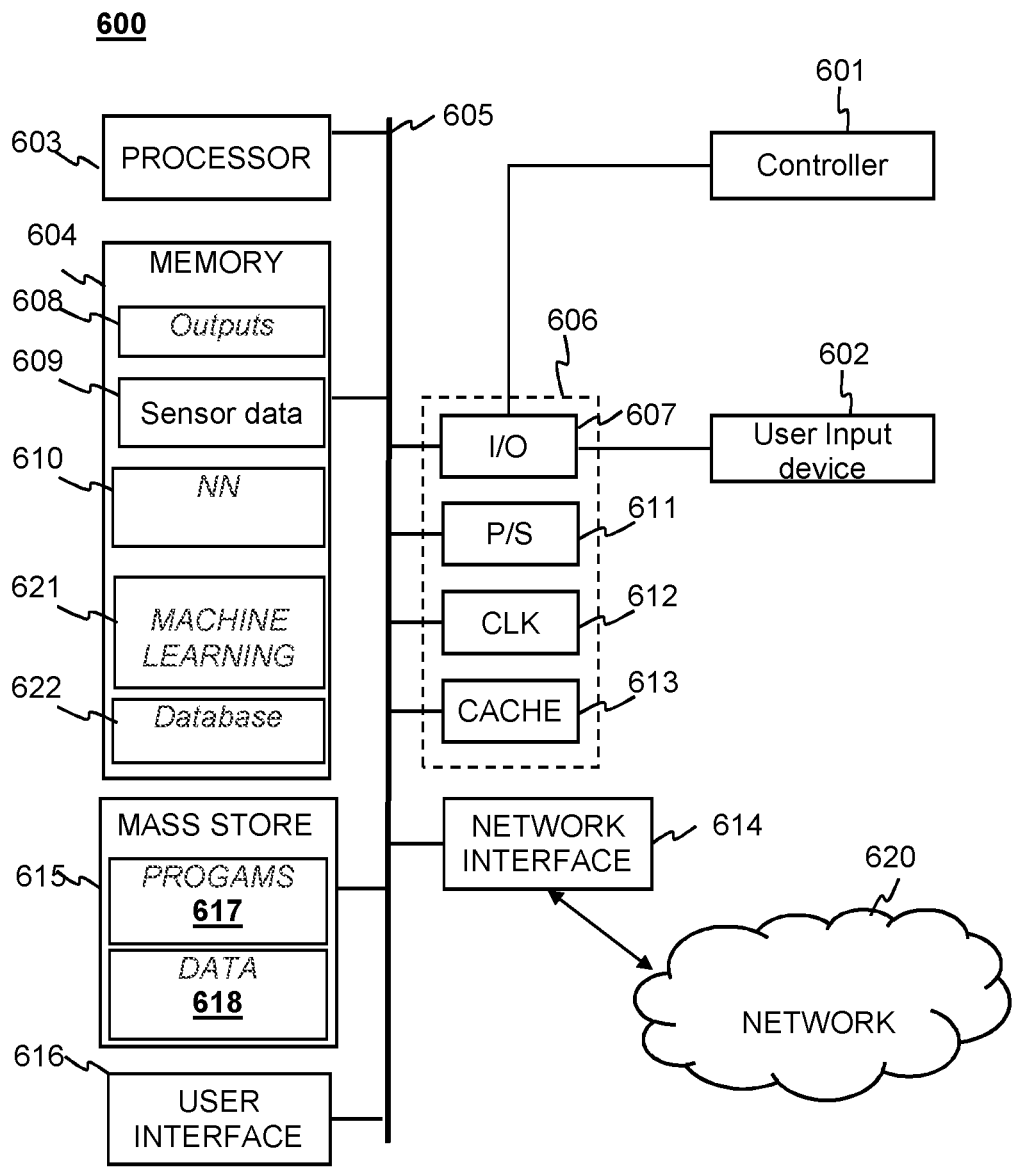
FIG. 6 is a system-level block diagram depicting a system implementing the training of neural networks and use of the motion control according to aspects of the present disclosure.

Control inputs obtained as discussed herein may be used for control of physical robots as well as for control of robot simulations, e.g., in video games, cloud video games, or game development engines, such as Unity3D from Unity Technologies of San Francisco, California, Lumberyard from Amazon Game Studios of Seattle, Washington, and Unreal Engine by Epic Games of Cary, North Carolina System FIG. 6 depicts a system for physics based character animation using NNs with reinforcement learning like that shown in Figures throughout the specification for example FIGS. 2, 3, 4 and 5. The system may include a computing device 600 coupled to a user input device 602. The user input device 602 may be a controller, touch screen, microphone, keyboard, mouse, joystick or other device that allows the user to input information including sound data in to the system. The user input device may be coupled to a haptic feedback device 621. The haptic feedback device 621 may be for example a vibration motor, force feedback system, ultrasonic feedback system, or air pressure feedback system.

Additionally the system may include a controller 601 for a movable joint for example and without limitation, the controller may control a motor or actuator for a joint.

The computing device 600 may include one or more processor units 603, which may be configured according to well-known architectures, such as, e.g., single-core, dual-core, quad-core, multi-core, processor-coprocessor, cell processor, and the like. The computing device may also include one or more memory units 604 (e.g., random access memory (RAM), dynamic random access memory (DRAM), read-only memory (ROM), and the like).

The processor unit 603 may execute one or more programs, portions of which may be stored in the memory 604 and the processor 603 may be operatively coupled to the memory, e.g., by accessing the memory via a data bus 605. The programs may include machine learning algorithms 621 configured adjusts the weights and transition values of NNs 610 as discussed above where, the NNs 610. Additionally, the Memory 604 may store an integrated outputs 608 that may be used, as input to the NNs 610 as state data additionally the integrated outputs may be stored database 622 for later training iterations. Sensor data 609 generated from the sensor may be stored in the Memory 604 and used as state data with the NNs 610 where the sensor data is either from a real sensor or a virtual model. The memory 604 may also store a database 622, the database may contain other information such as information associated with creation and movement of the virtual character rig, reference movement information and movement simulations. Additionally, the database 622 may be used during generation of the error 608 to store integral values of Control data 609 according to FIG. 3, 4 or 5. The database 622, sensor data 609 integrated outputs 608 and machine-learning algorithms 621 may be stored as data 618 or programs 617 in the Mass Store 618 or at a server coupled to the Network 620 accessed through the network interface 614.

Control data and the error, may be stored as data 618 in the Mass Store 615. The processor unit 603 is further configured to execute one or more programs 617 stored in the mass store 615 or in memory 604 which cause processor to carry out the one or more of the methods described above.

The computing device 600 may also include well-known support circuits, such as input/output (I/O) 607, circuits, power supplies (P/S) 611, a clock (CLK) 612, and cache 613, which may communicate with other components of the system, e.g., via the bus 605. The computing device may include a network interface 614. The processor unit 603 and network interface 614 may be configured to implement a local area network (LAN) or personal area network (PAN), via a suitable network protocol, e.g., Bluetooth, for a PAN. The computing device may optionally include a mass storage device 615 such as a disk drive, CD-ROM drive, tape drive, flash memory, or the like, and the mass storage device may store programs and/or data. The computing device may also include a user interface 616 to facilitate interaction between the system and a user. The user interface may include a monitor, Television screen, speakers, headphones or other devices that communicate information to the user.

The computing device 600 may include a network interface 614 to facilitate communication via an electronic communications network 620. The network interface 614 may be configured to implement wired or wireless communication over local area networks and wide area networks such as the Internet. The device 600 may send and receive data and/or requests for files via one or more message packets over the network 620. Message packets sent over the network 620 may temporarily be stored in a buffer in memory 604. The control data 609 and NNs 610 may be available through the network 620 and stored partially in memory 604 for use.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for control input, comprising:
    a) taking an integral of an output value from a trained Motion Decision Neural Network for one or more movable joints to generate an integrated output value;
    b) generating a subsequent output value using a machine learning algorithm that includes each of a sensor value, the integrated output value, and one or more of visual information, sound information, motion information, as inputs to the trained Motion Decision Neural Network, wherein the sensor value is generated by one or more sensors and the one or more of visual information, sound information, motion information is generated by one or more other sensors, wherein the one or more sensors is a different type of sensor than the one or more other sensors; and
    c) imparting movement with the one or more moveable joints according to an integral of the subsequent output value.

2. The method of claim 1, wherein the movable joint is in a virtual simulation.

3. The method of claim 1, wherein the movable joint is a motorized joint.

4. The method from claim 1, wherein c) includes changing a position of the one or more movable joints using the subsequent output value and updating the sensor value and providing the subsequent integrated output value to the motion decision NN.

5. The method of claim 4, further comprising repeating steps a) through c).

6. The method of claim 1, wherein the integral of an output value is a first integral of the output value and the integral of the subsequent output value is a first integral of the subsequent output value.

7. The method of claim 1, wherein the integral of an output value is a second integral of the output value and the integral of the subsequent output value is a second integral of the subsequent output value.

8. The method of claim 7, further comprising taking a first integral of the output value and wherein the integrated output value includes the first integral of the output value and the second integral of the output value.

9. The method of claim 1, wherein the visual information, sound information, or motion information indicate the presence of a person or other important object.

10. The method of claim 1, wherein the sensor value corresponds to an output of a sensor on a robot.

11. The method of claim 10, wherein the sensor value corresponds to one or more of a joint position, a joint velocity, a joint torque, a robot orientation, a robot linear velocity, a robot angular velocity, a foot contact point, a foot pressure or some combination of two or more of these.

12. The method of claim 1, wherein the sensor value corresponds to an output of virtual sensor of a robot simulation.

13. The method of claim 12, wherein the sensor value corresponds to a joint position, a joint velocity, a joint torque, a character orientation, a model linear velocity, a character angular velocity, a foot contact point, a foot pressure, or some combination of two or more of these.

14. The method of claim 1, wherein the control input is a control input of a video game.

15. The method of claim 1, wherein the control input is a control input of a cloud game.

16. The method of claim 1, wherein the control input is a control input of a game development engine.

17. A system for motion control, comprising:
a processor;
a memory coupled to the processor;
non-transitory instructions embedded in the memory that when executed by the processor cause the processor to carry out the method comprising:
 a) taking an integral of an output value from a trained Motion Decision Neural Network for one or more movable joints to generate an integrated output value;
 b) generating a subsequent output value using a machine learning algorithm that includes each of a sensor value, the integrated output value, and one or more of visual information, sound information, motion information, as inputs to the trained Motion Decision Neural Network, wherein the sensor value is generated by one or more sensors and the one or more of visual information, sound information, motion information is generated by one or more other sensors, wherein the one or more sensors is a different type of sensor than the one or more other sensors; and
 c) imparting movement with the one or more moveable joints according to an integral of the subsequent output value.

18. The system of claim 17, wherein the movable joint is in a virtual simulation.

19. The system of claim 17, further comprising a motorized movable joint and wherein the movable joint is the motorized movable joint.

20. The system from claim 17, wherein c) includes changing a position of the one or more movable joints using the subsequent output value and updating the sensor value and providing the subsequent integrated output value to the motion decision NN.

21. The system of claim 20, further comprising repeating steps a) through c).

22. The system of claim 17, wherein the integral of an output value is a first integral of the output value and the integral of the subsequent output value is a first integral of the subsequent output value.

23. The system of claim 17, wherein the integral of an output value is a second integral of the output value and the integral of the subsequent output value is a second integral of the subsequent output value.

24. The system of claim 23, further comprising taking a first integral of the output value and wherein the integrated output value includes the first integral of the output value and the second integral of the output value.

25. The system of claim 17, wherein the visual information, sound information, or motion information indicate the presence of a person or other important object.

26. The system of claim 17, wherein the sensor value corresponds to an output of a sensor on a robot.

27. The system of claim 26, wherein the sensor value corresponds to one or more of a joint position, a joint velocity, a joint torque, a robot orientation, a robot linear velocity, a robot angular velocity, a foot contact point, a foot pressure or two or more of these.

28. The system of claim 17, wherein the sensor value corresponds to a virtual sensor of a robot simulation.

29. The system of claim 28, wherein the sensor value corresponds to a joint position, a joint velocity, a joint torque, a character orientation, a character linear velocity, a character angular velocity, a character foot contact point, a foot pressure or two or more of these.

30. The system of claim 17, wherein the control input is a control input of a video game.

31. The system of claim 17, wherein the control input is a control input of a cloud game.

32. The system of claim 17, wherein the control input is a control input of a game development engine.

33. Non-transitory instructions embedded in a computer readable medium that when executed by a computer cause the computer to carry out the method comprising:
 a) taking an integral of an output value from a trained Motion Decision Neural Network for one or more movable joints to generate an integrated output value;
 b) generating a subsequent output value using a machine learning algorithm that includes each of a sensor value, the integrated output value, and one or more of visual information, sound information, motion information, as inputs to the trained Motion Decision Neural Network, wherein the sensor value is generated by one or more sensors and the one or more of visual information, sound information, motion information is generated by one or more other sensors, wherein the one or more sensors is a different type of sensor than the one or more other sensors; and
 c) imparting movement with the one or more moveable joints according to an integral of the subsequent output value.

* * * * *